US012713756B2

(12) United States Patent
Lee et al.

(10) Patent No.: US 12,713,756 B2
(45) Date of Patent: Aug. 18, 2026

(54) DISPLAY APPARATUS HAVING AN OXIDE SEMICONDUCTOR

(71) Applicant: LG Display Co., Ltd., Seoul (KR)

(72) Inventors: Bok Young Lee, Paju-si (KR); Yong Il Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 409 days.

(21) Appl. No.: 18/371,706

(22) Filed: Sep. 22, 2023

(65) Prior Publication Data

US 2024/0215337 A1 Jun. 27, 2024

(30) Foreign Application Priority Data

Dec. 22, 2022 (KR) ........................ 10-2022-0182211

(51) Int. Cl.

| | |
|---|---|
| ***H10H 29/41*** | (2025.01) |
| ***H10D 30/67*** | (2025.01) |
| ***H10D 86/40*** | (2025.01) |
| ***H10D 86/60*** | (2025.01) |
| ***H10H 29/01*** | (2025.01) |

(Continued)

(52) U.S. Cl.

CPC ........ *H10H 29/41* (2025.01); *H10D 30/6755* (2025.01); *H10D 86/423* (2025.01); *H10D 86/451* (2025.01); *H10D 86/60* (2025.01); *H10H 29/012* (2025.01); *H10H 29/32* (2025.01); *H10H 29/842* (2025.01);

(Continued)

(58) Field of Classification Search

CPC ...... H10H 29/41; H10H 29/012; H10H 29/32; H10H 29/842; H10H 29/39; H10D 30/6755; H10D 86/423; H10D 86/451; H10D 86/60; H10K 59/1213; H10K 59/124; H10K 50/11

See application file for complete search history.

(56) References Cited

U.S. PATENT DOCUMENTS

| | | | | |
|---|---|---|---|---|
| 8,441,010 B2 * | 5/2013 | Ichijo | ................. | H10D 30/6755 257/411 |
| 8,552,425 B2 * | 10/2013 | Ichijo | .................... | H01L 21/441 257/E29.296 |

(Continued)

FOREIGN PATENT DOCUMENTS

| | | | |
|---|---|---|---|
| KR | 10-2017-0097776 | 8/2017 | |
| KR | 20200077680 A * | 7/2020 | ........... H10D 30/031 |

(Continued)

*Primary Examiner* — Earl N Taylor

(74) *Attorney, Agent, or Firm* — PnK IP LLC

(57) ABSTRACT

A display apparatus include a driving thin film transistor electrically connected to a light-emitting device on each pixel area. The driving thin film transistor may include a driving semiconductor pattern. The driving semiconductor pattern may include an oxide semiconductor. The driving semiconductor pattern may be surrounded by an insulating layer made of fluorinated silicon nitride (SiNF). Thus, in the display apparatus, inflow of hydrogen and oxygen in direction of the driving thin film transistor may be prevented. Therefore, in the display apparatus, changes in characteristics of the driving thin film transistor due to the inflow of the hydrogen and oxygen can be prevented. Accordingly, decrease in the quality of the image in the display apparatus due to the hydrogen and oxygen can be prevented.

14 Claims, 6 Drawing Sheets

(51) Int. Cl.

| | |
|---|---|
| ***H10H 29/32*** | (2025.01) |
| ***H10H 29/39*** | (2025.01) |
| ***H10H 29/80*** | (2025.01) |
| ***H10K 59/121*** | (2023.01) |
| ***H10K 59/124*** | (2023.01) |

(52) U.S. Cl.

CPC ....... *H10K 59/1213* (2023.02); *H10K 59/124* (2023.02); *H10H 29/39* (2025.01)

(56) References Cited

U.S. PATENT DOCUMENTS

| | | | | |
|---|---|---|---|---|
| 11,114,472 | B2 * | 9/2021 | Kim | H10D 86/411 |
| 2011/0309355 | A1 * | 12/2011 | Ichijo | H10D 30/673<br>257/E29.296 |
| 2012/0001168 | A1 * | 1/2012 | Ichijo | H10D 30/6755<br>257/E29.296 |
| 2017/0263651 | A1 * | 9/2017 | Tochibayashi | H10D 86/423 |
| 2018/0033644 | A1 * | 2/2018 | Takahashi | H10D 99/00 |
| 2018/0076238 | A1 * | 3/2018 | Lim | H10D 30/6745 |
| 2018/0174863 | A1 * | 6/2018 | Wang | H05K 3/0011 |
| 2018/0219029 | A1 * | 8/2018 | Hanyu | H01L 21/0262 |
| 2018/0331128 | A1 * | 11/2018 | Hanyu | H10D 86/471 |
| 2019/0006525 | A1 * | 1/2019 | Uraoka | H01L 21/02211 |
| 2020/0203388 | A1 * | 6/2020 | Kim | H10D 86/60 |
| 2021/0202672 | A1 * | 7/2021 | Kim | H10D 86/451 |

FOREIGN PATENT DOCUMENTS

| | | | |
|---|---|---|---|
| KR | 20200107026 | A | 9/2020 |
| KR | 10-2021-0086472 | | 7/2021 |
| KR | 10-2414598 | B1 | 6/2022 |

* cited by examiner

DL
PL
EN1
GL1
T4
T3
N2
N1
T2
DC
GL2
Cst
T1
N3
EN2
T5
N4
N5
T6
500
RL

DISPLAY APPARATUS HAVING AN OXIDE SEMICONDUCTOR

CROSS-REFERENCE TO RELATED APPLICATION

This application claims the priority of Korean Patent Application No. 10-2022-0182211, filed on Dec. 22, 2022, which is hereby incorporated by reference in its entirety.

BACKGROUND

Field of the Disclosure

The present disclosure relates to a display apparatus in which a driving semiconductor pattern of each pixel area includes an oxide semiconductor.

Description of the Background

Generally, a display apparatus provides an image to user. For example, the display apparatus may include a plurality of light-emitting device. Each of the light-emitting devices may emit light displaying a specific color. For example, each of the light-emitting devices may include a light-emitting layer between a first electrode and a second electrode.

Each of the light-emitting devices may be controlled by a pixel driving circuit. For example, the display apparatus may include pixel areas in which the pixel driving circuit electrically connected to the light-emitting device is disposed. The pixel driving circuit of each pixel area may supply a driving current corresponding to a data signal to the light-emitting device of the corresponding pixel area according to a gate signal. For example, the pixel driving circuit of each pixel area may include a driving thin film transistor generating the driving current and at least one switching thin film transistor transmitting the data signal to the driving thin film transistor according to the gate signal.

The driving thin film transistor may include a driving semiconductor pattern, a driving gate electrode, a driving source electrode and a driving drain electrode. The driving semiconductor pattern may have an electric conductivity corresponding to a voltage applied to the driving gate electrode. For example, the driving current may be changed according to a voltage applied to the driving gate electrode. The driving semiconductor pattern may include a semiconductor material. For example, the driving semiconductor pattern may include an oxide semiconductor.

However, the electric characteristics of an oxide semiconductor may be changed according to contents of hydrogen and/or oxygen. For example, in the display apparatus, a threshold voltage of the driving thin film transistor may be changed by hydrogen and/or oxygen flowing into the driving semiconductor pattern. Thus, in the display apparatus, deviation in characteristics of the driving thin film transistor may occur. Therefore, in the display apparatus, a quality of the image may be decreased.

SUMMARY

Accordingly, the present disclosure is directed to a display apparatus that substantially obviates one or more problems due to limitations and disadvantages of the related art.

More specifically, the present disclosure is to provide a display apparatus capable of preventing variation in characteristics of the driving thin film transistor due to inflow of hydrogen and oxygen.

The present disclosure is also to provide a display apparatus capable of preventing the inflow of hydrogen and oxygen into the driving semiconductor pattern of each pixel region.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the present disclosure, as embodied and broadly described herein, there is provided a display apparatus comprising a device substrate. A first insulating layer and a driving thin film transistor are disposed on the device substrate. The driving thin film transistor includes a driving semiconductor pattern on the first insulating layer. A second insulating layer is disposed on the first insulating layer. The second insulating layer covers the driving semiconductor pattern. A light-emitting device is disposed on the second insulating layer. The light-emitting device is electrically connected to the driving thin film transistor. The driving semiconductor pattern includes an oxide semiconductor. Each of the first insulating layer and the second insulating layer is an inorganic insulating layers made of fluorinated silicon nitride (SiNF).

The driving semiconductor pattern may be in contact with the first insulating layer and the second insulating layer.

An interlayer insulating layer may be disposed between the second insulating layer and the light-emitting device. The interlayer insulating layer may have an etch selectivity with the first insulating layer and the second insulating layer.

The interlayer insulating layer may be an inorganic insulating layer made of silicon oxide (SiOx).

The device substrate may include a separating area between a hole area and a pixel area. The driving thin film transistor and the light-emitting device may be disposed on the pixel area of the device substrate. An under-cut structure by the second insulating layer and the interlayer insulating layer may be disposed on the separating area. A light-emitting layer of the light-emitting device may be disconnected by the under-cut structure of the separating area.

A dam may be disposed on the separating area of the device substrate. The under-cut structure may be disposed between the dam and the hole area.

A third insulating layer may be disposed between the device substrate and the first insulating layer. A circuit thin film transistor may be disposed on a circuit area of the device substrate. The circuit thin film transistor may include a circuit semiconductor pattern between the third insulating layer and the first insulating layer. The third insulating layer may be an inorganic insulating layer made of silicon oxide (SiOx).

The circuit semiconductor pattern may include an oxide semiconductor.

A fourth insulating layer may be disposed between the third insulating layer and the first insulating layer. The fourth insulating layer may cover the circuit semiconductor pattern. The fourth insulating layer may be an inorganic insulating layer made of fluorinated silicon oxide (SiOF).

The circuit semiconductor pattern may be in contact with the third insulating layer and the fourth insulating layer.

In another aspect, there is provided a display device comprising a device substrate. The device substrate includes a separating area between a hole area and a pixel area. An upper buffer layer is disposed on the pixel area and the separating area of the device substrate. A first thin film transistor and a second thin film transistor are disposed on the pixel area of the device substrate. The first thin film transistor includes a first semiconductor pattern on the upper buffer layer. A first gate insulating layer covering the first semiconductor pattern is disposed on the upper buffer layer. A second thin film transistor includes a second semiconductor pattern on the first gate insulating layer. A second gate insulating layer covering the second semiconductor pattern is disposed on the first gate insulating layer. An interlayer insulating layer is disposed on the second gate insulating layer. The interlayer insulating layer has an etch selectivity with the first gate insulating layer and the second gate insulating layer. A light-emitting device is disposed on the interlayer insulating layer. The light-emitting device is electrically connected to the second thin film transistor. The first semiconductor pattern and the second semiconductor pattern include an oxide semiconductor. The first gate insulating layer and the second gate insulating layer are an insulating layer made of fluorinated silicon nitride (SiNF). An end of the second gate insulating layer on the separating area is disposed closer to the pixel area than an end of the interlayer insulating layer on the separating area.

A thickness of the first gate insulating layer may be smaller than a thickness of the second gate insulating layer.

A separating pattern may be disposed between the first gate insulating layer and the second gate insulating layer of the separating area. The separating pattern may have an etch selectivity with the first gate insulating layer and the second gate insulating layer. An end of the first gate insulating layer on the separating area may be disposed closer to the pixel area than an end of the separating pattern toward the hole area.

The separating pattern may include a same material as the second semiconductor pattern.

A lower buffer layer may be disposed between the device substrate and the upper buffer layer. The upper buffer layer may have an etch selectivity with the lower buffer layer, the first gate insulating layer and the second gate insulating layer. An end of the lower buffer layer on the separating area may be disposed closer to the pixel area than an end of the upper buffer layer on the separating area.

BRIEF DESCRIPTION OF THE DRAWINGS

The accompanying drawings, which are included to provide a further understanding of the present disclosure and are incorporated in and constitute a part of this application, illustrate aspect of the present disclosure and together with the description serve to explain the principle of the present disclosure.

In the drawings:

FIG. 2 is a view showing a circuit of a unit pixel area in the display apparatus according to the aspect of the present disclosure;

FIG. 3 is a view taken along I-I' of FIG. 1;

DETAILED DESCRIPTION

Figure 1:
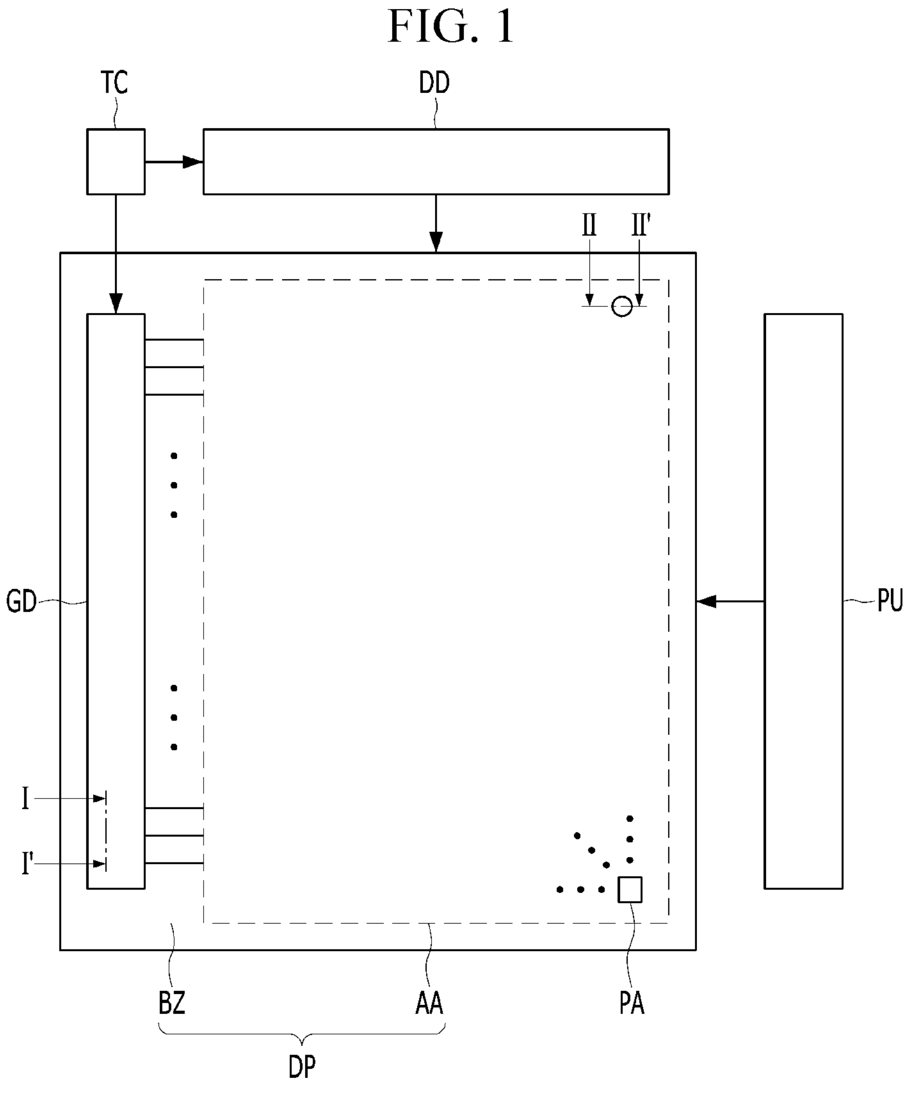
FIG. 1 is a view schematically showing a display apparatus according to an aspect of the present disclosure.

Hereinafter, details related to the above technical configurations, and operational effects of the aspects of the present disclosure will be clearly understood by the following detailed description with reference to the drawings, which illustrate some aspects of the present disclosure. Here, the aspects of the present disclosure are provided to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Aspect

Figures 2, 3:
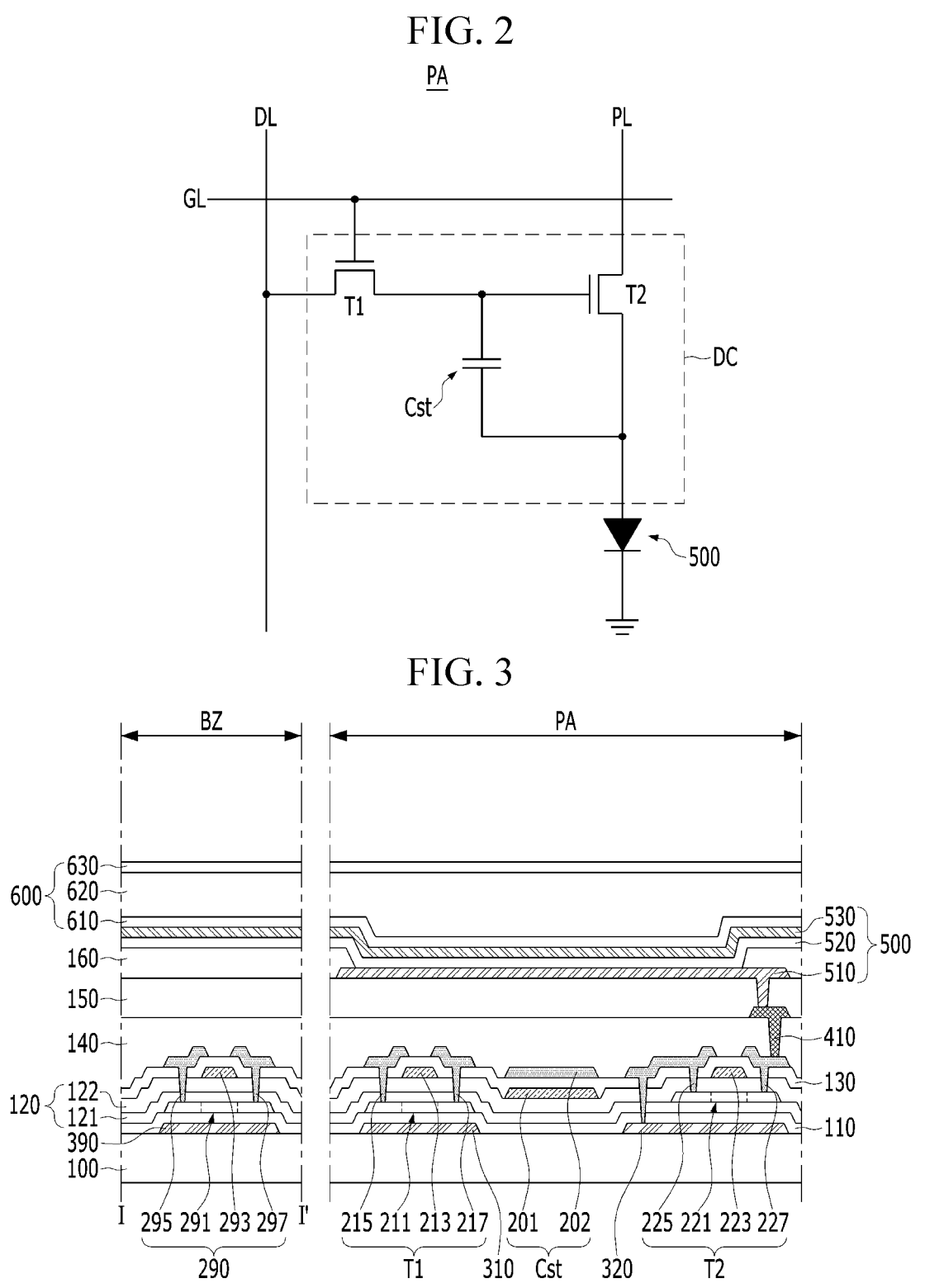
Figure 4:
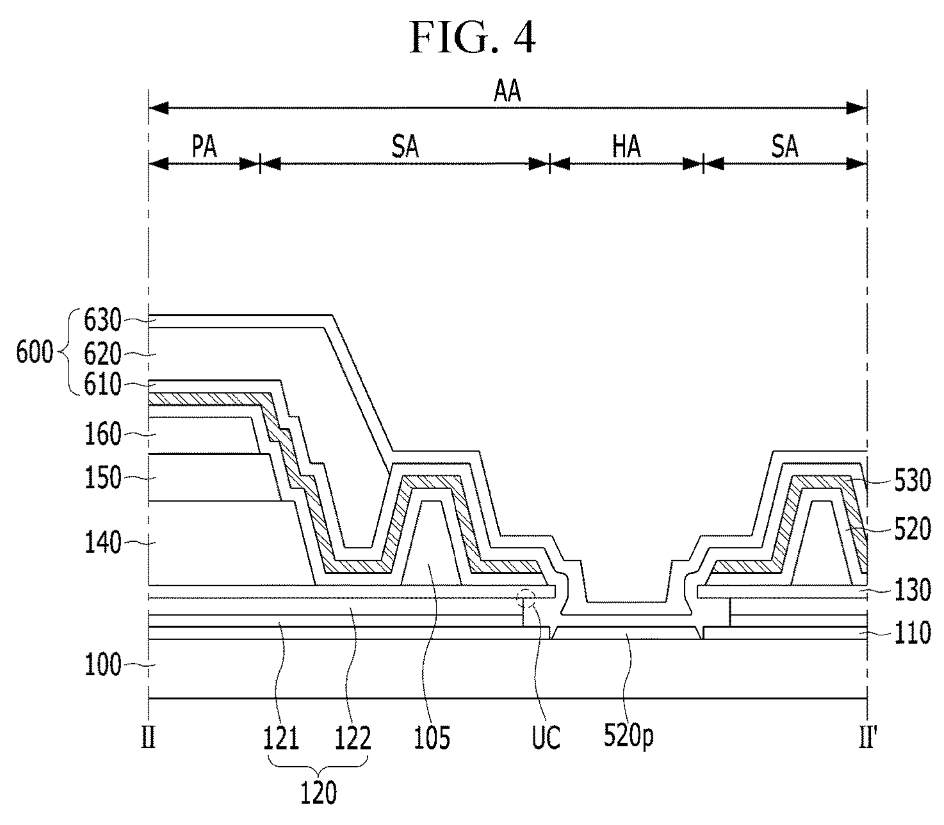
FIG. 4 is a view taken along II-II' of FIG. 1.

FIG. 1 is a view schematically showing a display apparatus according to an aspect of the present disclosure. FIG. 2 is a view showing a circuit of a unit pixel area in the display apparatus according to the aspect of the present disclosure. FIG. 3 is a view taken along I-I' of FIG. 1. FIG. 4 is a view taken along II-II' of FIG. 1.

Referring to FIGS. 1 to 4, the display apparatus according to the aspect of the present disclosure may include a display panel DP. The display panel DP may generate an image provided to a user. For example, the display panel DP may include a plurality of pixel area PA.

Various signals may be provided in each pixel area PA through signal wirings GL, DL and PL. For example, the signal wirings GL, DL and PL may include gate lines GL applying a gate signal to each pixel area PA, data lines DL applying a data signal to each pixel area PA, and power voltage supply lines PL supplying a power voltage to each pixel area PA. The gate lines GL may be electrically connected to a gate driver GD, and the data lines DL may be electrically connected to a data driver DD. The power voltage supply lines PL may be electrically connected to a power unit PU.

The gate driver GD and the data driver DD may be controlled by a timing controller TC. For example, the gate driver GD may receive clock signals, reset signals and start signals from the timing controller TC, and the data driver DD may receive digital video data and a source timing signal from the timing controller TC.

Each of the pixel areas PA may realize a specific color. For example, a pixel driving circuit DC electrically connected to a light-emitting device 500 may be disposed in each pixel area PA. The light-emitting device 500 and the pixel driving circuit DC of each pixel area PA may be disposed on a device substrate 100. The device substrate 100 may include an insulating material. For example, the device substrate 100 may include glass or plastic.

The light-emitting device 500 may emit light displaying a specific color. For example, the light-emitting device 500 may include a first electrode 510, a light-emitting layer 520 and a second electrode 530, which are sequentially stacked.

The first electrode 510 may include a conductive material. The first electrode 510 may include a material having a relatively high reflectance. For example, the first electrode 510 may be a metal, such as aluminum (Al) and silver (Ag). The first electrode 510 may have a multi-layer structure. For example, the first electrode 510 may have a structure in which a reflective electrode made of a metal is disposed between transparent electrodes made of a transparent conductive material, such as ITO and IZO.

The light-emitting layer 520 may generate light having luminance corresponding to a voltage difference between the first electrode 510 and the second electrode 530. For example, the light-emitting layer 520 may include an emission material layer (EML) having an emission material. The emission material may include an organic material, an inorganic material or a hybrid material. For example, the display apparatus according to the aspect of the present disclosure may be an organic light-emitting display apparatus including an organic emission material.

The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display apparatus according to the aspect of the present disclosure, the emission efficiency of the light-emitting layer 520 may be improved.

The second electrode 530 may include a conductive material. The second electrode 530 may include a material different from the first electrode 510. A transmittance of the second electrode 530 may be higher than a transmittance of the first electrode 510. For example, the second electrode 530 may be a transparent electrode made of a transparent conductive material, such as ITO and IZO. Thus, in the display apparatus according to the aspect of the present disclosure, the light generated by the light-emitting layer 520 may be emitted outside through the second electrode 50.

The pixel driving circuit DC may supply a driving current corresponding to the data signal to the light-emitting device 500 according to the gate signal for one frame. For example, the pixel driving circuit DC may include a first thin film transistor T1, a second thin film transistor T2 and a storage capacitor Cst.

The first thin film transistor T1 may include a first semiconductor pattern 211, a first gate electrode 213, a first source electrode 215 and a first drain electrode 217. The first thin film transistor T1 may transmit the data signal to the second thin film transistor T2 according to the gate signal. For example, the first thin film transistor T1 may be a switching thin film transistor. The first gate electrode 213 may be electrically connected to the gate line GL, and the first source electrode 215 may be electrically connected to the date line DL.

The first semiconductor pattern 211 may include a semiconductor material. For example, the first semiconductor pattern 211 may include an oxide semiconductor, such as IGZO. The first semiconductor pattern 211 may include a first source region, a first channel region and a first drain region. The first channel region may be disposed between the first source region and the first drain region. A resistance of the first source region and a resistance of the first drain region may be smaller than a resistance of the first channel region. For example, the first source region and the first drain region may include a conductorized region of an oxide semiconductor. The first channel region may be a region of an oxide semiconductor, which is not conductorized.

The first gate electrode 213 may include a conductive material. For example, the first gate electrode 213 may include a metal, such as aluminum (Al), chrome (Cr), copper (Cu), molybdenum (Mo), titanium (Ti) and tungsten (W). The first gate electrode 213 may be disposed on the first semiconductor pattern 211. For example, the first gate electrode 213 may overlap with the first channel region of the first semiconductor pattern 211. The first source region and the first drain region of the first semiconductor pattern 211 may be disposed outside the first gate electrode 213. The first gate electrode 213 may be insulated from the first semiconductor pattern 211. For example, the first source region of the first semiconductor pattern 211 may be electrically connected to the first drain region of the first semiconductor pattern 211 according to the gate signal.

The first source electrode 215 may include a conductive material. For example, the first source electrode 215 may include a metal, such as aluminum (Al), chrome (Cr), copper (Cu), molybdenum (Mo), titanium (Ti) and tungsten (W). The first source electrode 215 may include a material different from the first gate electrode 213. The first source electrode 215 may be disposed on a layer different from the first gate electrode 213. For example, the first source electrode 215 may be insulated from the first gate electrode 213. The first source electrode 215 may be electrically connected to the first source region of the first semiconductor pattern 211.

The first drain electrode 217 may include a conductive material. For example, the first drain electrode 217 may include a metal, such as aluminum (Al), chrome (Cr), copper (Cu), molybdenum (Mo), titanium (Ti) and tungsten (W). The first drain electrode 217 may include a material different from the first gate electrode 213. The first drain electrode 217 may be disposed on a layer different from the first gate electrode 213. For example, the first drain electrode 217 may be disposed on a same layer as the first source electrode 215. The first drain electrode 217 may include a same material as the first source electrode 215. The first drain electrode 217 may be insulated from the first gate electrode 213. For example, the first drain electrode 217 may be electrically connected to the first drain region of the first semiconductor pattern 211.

The second thin film transistor T2 may include a second semiconductor pattern 221, a second gate electrode 223, a second source electrode 225 and a second drain electrode 227. The second thin film transistor T2 may generate the driving current corresponding to the data signal. For example, the second thin film transistor T2 may be a driving thin film transistor. The second gate electrode 223 may be electrically connected to the first drain electrode 217, and the second source electrode 225 may be electrically connected to the power voltage supply line PL. The light-emitting device 500 may be electrically connected to the second thin film transistor T2. For example, the second drain electrode 227 may be electrically connected to the first electrode 510 of the light-emitting device 500.

The second semiconductor pattern 221 may include a semiconductor material. For example, the second semiconductor pattern 221 may include an oxide semiconductor, such as IGZO. The second semiconductor pattern 221 may include a second channel region between a second source region and a second drain region. The second channel region may have a resistance larger than the second source region and the second drain region. For example, the second source region and the second drain region may include a conductorized region of an oxide semiconductor, and the second channel region may be a region of an oxide semiconductor, which is not conductorized.

The second semiconductor pattern 221 may be disposed on a layer different from the first semiconductor pattern 211. For example, the second semiconductor pattern 221 may include a material different from the first semiconductor pattern 211. Electric characteristics of the second semiconductor pattern 221 may be different from electric characteristics of the first semiconductor pattern 211. For example, a mobility of electrons in the second semiconductor pattern 221 may be different from a mobility of electrons in the first semiconductor pattern 211.

The second gate electrode 223 may include a conductive material. For example, the second gate electrode 213 may include a metal, such as aluminum (Al), chrome (Cr), copper (Cu), molybdenum (Mo), titanium (Ti) and tungsten (W). The second gate electrode 223 may be disposed on a same layer as the first gate electrode 213. For example, the second gate electrode 223 may include a same material as the first gate electrode 213. Thus, in the display apparatus according to the aspect of the present disclosure, a distance between the first gate electrode 213 and the first semiconductor pattern 211 may be different from a distance between the second gate electrode 223 and the second semiconductor pattern 221. That is, in the display apparatus according to the aspect of the present disclosure, electric characteristics of the second thin film transistor T2 may be different from electric characteristics of the first thin film transistor T1. Therefore, in the display apparatus according to the aspect of the present disclosure, an efficiency of the pixel driving circuit DC in each pixel area PA may be improved.

The second gate electrode 223 may be disposed on the second semiconductor pattern 221. For example, the second gate electrode 223 may overlap with the second channel region of the second semiconductor pattern 221. The second source region and the second drain region of the second semiconductor pattern 221 may be disposed outside the second gate electrode 223. The second gate electrode 223 may be insulated from the second semiconductor pattern 221. For example, the second channel region of the second semiconductor pattern 221 may have an electrical conductivity corresponding to a voltage applied to the second gate electrode 223.

The second source electrode 225 may include a conductive material. For example, the second source electrode 225 may include a metal, such as aluminum (Al), chrome (Cr), copper (Cu), molybdenum (Mo), titanium (Ti) and tungsten (W). The second source electrode 225 may include a material different from the second gate electrode 223. The second source electrode 225 may be disposed on a layer different from the second gate electrode 223. For example, the second source electrode 225 may be insulated from the second gate electrode 223. The second source electrode 225 may be electrically connected to the second source region of the second semiconductor pattern 221.

The second source electrode 225 may be disposed on a same layer as the first source electrode 215. The second source electrode 225 may include a same material as the first source electrode 215. For example, the second source electrode 225 may be formed simultaneously with the first source electrode 215. Thus, in the display apparatus according to the aspect of the present disclosure, process efficiency may be improved.

The second drain electrode 227 may include a conductive material. For example, the second drain electrode 227 may include a metal, such as aluminum (Al), chrome (Cr), copper (Cu), molybdenum (Mo), titanium (Ti) and tungsten (W). The second drain electrode 227 may include a material different from the second gate electrode 223. The second drain electrode 227 may be disposed on a layer different from the second gate electrode 223. For example, the second drain electrode 227 may be insulated from the second gate electrode 223. The second drain electrode 227 may be electrically connected to the second drain region of the second semiconductor pattern 221.

The second drain electrode 227 may be disposed on a same layer as the first drain electrode 217. The second drain electrode 227 may include a same material as the first drain electrode 217. For example, the second drain electrode 227 may be formed simultaneously with the first drain electrode 217. Thus, in the display apparatus according to the aspect of the present disclosure, process efficiency may be improved.

The storage capacitor Cst may maintain a signal applied to the second gate electrode 223 of the second thin film transistor T2 for one frame. For example, the storage capacitor Cst may be electrically connected between the second gate electrode 223 and the second drain electrode 227 of the second thin film transistor T2. The storage capacitor Cst may have a stacked structure of capacitor electrodes 201 and 202. The storage capacitor Cst may be formed using a process of forming the first thin film transistor T1 and the second thin film transistor T2. For example, the storage capacitor Cst may include a first capacitor electrode 201 disposed on a same layer as the second gate electrode 223 and a second capacitor electrode 202 disposed on a same layer as the second drain electrode 227. The first capacitor electrode 201 may include a same material as the second gate electrode 223. The second capacitor electrode 202 may include a same material as the second drain electrode 227. Thus, in the display apparatus according to the aspect of the present disclosure, process efficiency may be improved.

A plurality of insulating layers 110, 120, 130, 140, 150 and 160 for preventing unnecessary electrical connection in each pixel area PA may be disposed on the device substrate 100. For example, a buffer insulating layer 110, agate insulating layer 120, an interlayer insulating layer 130, a first planarization layer 140, a second planarization layer 150 and a bank insulating layer 160 may be disposed on the device substrate 100.

The buffer insulating layer 110 may be disposed close to the device substrate 100. The buffer insulating layer 110 may prevent pollution due to the device substrate 100 in a process of forming the pixel driving circuit DC of each pixel area PA. For example, an upper surface of the device substrate 100 toward the pixel driving circuit DC of each pixel area PA may be completely covered by the buffer insulating layer 110. The first semiconductor pattern 211 and the second semiconductor pattern 221 of each pixel area PA may be disposed on the buffer insulating layer 110 of the corresponding pixel area PA. The buffer insulating layer 110 may include an insulating material. For example, the buffer insulating layer 110 may be an inorganic insulating layer made of silicon oxide (SiOx).

A first light-blocking pattern 310 and a second light-blocking pattern 320 may be disposed between the device substrate 100 and the buffer insulating layer 110 of each pixel area PA. For example, the first light-blocking pattern 310 and the second light-blocking pattern 320 may be in direct contact with the device substrate 100 and the buffer insulating layer 110. The second light-blocking pattern 320 may be spaced apart from the first light-blocking pattern 310. The first light-blocking pattern 310 and the second light-blocking pattern 320 may include a material capable of blocking light. The first light-blocking pattern 310 and the second light-blocking pattern 320 may include a conductive material. For example, the first light-blocking pattern 310 and the second light-blocking pattern 320 may include a metal, such as aluminum (Al), chrome (Cr), copper (Cu), molybdenum (Mo), titanium (Ti) and tungsten (W).

The first light-blocking pattern 310 may overlap with the first semiconductor pattern 211. External light traveling in a direction of the first semiconductor pattern 211 passing through the device substrate 100 may be blocked by the first light-blocking pattern 310. For example, a size of the first light-blocking pattern 310 may be larger than a size of the first semiconductor pattern 211. The second light-blocking pattern 320 may overlap with the second semiconductor pattern 221. External light traveling in a direction of the second semiconductor pattern 221 passing through the device substrate 100 may be blocked by the second light-blocking pattern 320. For example, a size of the second light-blocking pattern 320 may be larger than a size of the second semiconductor pattern 221. Thus, in the display apparatus according to the aspect of the present disclosure, changes in the characteristics of the first thin film transistor T1 and the second thin film transistor T2 in each pixel area PA due to the external light may be prevented.

A specific voltage may be applied to the first light-blocking pattern 310 in each pixel area PA. For example, the first light-blocking pattern 310 of each pixel area PA may be electrically connected to the first gate electrode 213 of the corresponding pixel area PA. The first light-blocking pattern 310 of each pixel area PA may function as a gate electrode of the first thin film transistor T1 in the corresponding pixel area PA. Thus, in the display apparatus according to the aspect of the present disclosure, on/off of the first thin film transistor T1 in each pixel area may be quickly switched.

A specific voltage may be applied to the second light-blocking pattern 320 in each pixel area PA. For example, the second light-blocking pattern 320 of each pixel area PA may be electrically connected to the second source electrode 225 of the corresponding pixel area PA. Thus, in the display apparatus according to the aspect of the present disclosure, changes in the electric characteristics of the second semiconductor pattern 221 due to a deviation in a voltage applied to the second light-blocking pattern 320 of each pixel area PA may be prevented. Therefore, in the display apparatus according to the aspect of the present disclosure, a decrease in a quality of the image due to the variation in characteristics of the second thin film transistor T1 may be prevented.

The gate insulating layer 120 may be disposed on the buffer insulating layer 110. The gate insulating layer 120 may insulate between the semiconductor patterns 211 and 221 and the gate electrode 213 and 223 of each thin film transistor T1 and T2. For example, the gate insulating layer 120 may include a first gate insulating layer 121 insulating between the first semiconductor pattern 211 and the first gate electrode 213 of each pixel area PA, and a second gate insulating layer 122 insulating between the second semiconductor pattern 221 and the second gate electrode 223 of each pixel area PA.

The first semiconductor pattern 211 of each pixel area PA may be disposed closer to the device substrate 100 than the second semiconductor pattern 221 of the corresponding pixel area PA. For example, the first gate insulating layer 121 may cover the first semiconductor pattern 211 of each pixel area PA, and the second semiconductor pattern 221 of each pixel area PA may be disposed on the first gate insulating layer 121. The first gate insulating layer 121 may be disposed between the buffer insulating layer 110 and the second gate insulating layer 122. The second semiconductor pattern 221 of each pixel area may be disposed between the first gate insulating layer 121 and the second gate insulating layer 122. The second semiconductor pattern 221 of each pixel area PA may be covered by the second gate insulating layer 122. For example, the second semiconductor pattern 221 of each pixel area PA may be in direct contact with the first gate insulating layer 121 and the second gate insulating layer 122.

The first gate insulating layer 121 and the second gate insulating layer 122 may include an insulating material. The first gate insulating layer 121 and the second gate insulating layer 122 may include a material capable of preventing the inflow of hydrogen and oxygen into the second semiconductor pattern 221 of each pixel area PA. For example, the first gate insulating layer 121 and the second gate insulating layer 122 may be an inorganic insulating layer made of fluorinated silicon nitride (SiNF). Thus, in the display apparatus according to the aspect of the present disclosure, variation in characteristics of the second semiconductor pattern 221 in each pixel area PA due to inflow of hydrogen and oxygen may be prevented.

When the second semiconductor pattern 221 of each pixel area PA has electric characteristics different from the second semiconductor patter 221 of adjacent pixel area PA due to the inflow of hydrogen and/or oxygen, the driving current generated by the second thin film transistor T2 of each pixel area PA may be different from the driving current generated by the second thin film transistor T2 of adjacent pixel area PA, in which a same data signal is applied. Light emitted from the light-emitting layer 520 of each pixel area PA may have a luminance corresponding to the driving current generated by the second thin film transistor T2 of the corresponding pixel area PA. Thus, when the electric characteristics of the second semiconductor pattern 221 in each pixel area PA is different from the electric characteristics of the second semiconductor patter 221 in adjacent pixel area PA, the luminance of the light emitted from the light-emitting device 500 of each pixel area PA may be different from the luminance of the light emitted from the light-emitting device 500 of adjacent pixel area PA, in which a same data signal is applied. That is, deviation in characteristics of the second semiconductors 221 due to the inflow of hydrogen and/or oxygen may decrease the quality of the image realized by the display panel DP.

In the display apparatus according to the aspect of the present disclosure, since the inflow of hydrogen and oxygen into the second semiconductor pattern 221 of each pixel area PA is prevented by the inorganic insulating layer made of fluorinated silicon nitride (SiNF), the second thin film transistor T2 of each pixel area PA may have an electric characteristics same as the second thin film transistor T2 of adjacent pixel area PA. That is, in the display apparatus according to the aspect of the present disclosure, the deviation in characteristics of the second thin film transistors T2 due to the inflow of hydrogen and oxygen may be prevented. Therefore, in the display apparatus according to the aspect of the present disclosure, deterioration of the image due to the inflow of hydrogen and oxygen may be prevented.

Fluorinated silicon nitride (SiNF) may be formed using tetrafluoro-silane ($SiF_4$). For example, fluorinated silicon nitride (SiNF) may be formed by supplying tetrafluoro-silane ($SiF_4$) gas and nitrogen ($N_2$) gas into a high-density plasma enhanced chemical vapor deposition (PECVD) chamber. Thus, fluorinated silicon nitride (SiNF) may contain a much smaller amount of hydrogen than silicon nitride (SiNx) formed using mono-silane ($SiH_4$). For example, the inorganic insulating layer made of silicon nitride (SiNx) formed using mono-silane ($SiH_4$) may have a hydrogen content of about 18.37%, but the inorganic insulating layer made of fluorinated silicon nitride (SiNF) formed using tetrafluoro-silane ($SiF_4$) may have a hydrogen content of less than 1%. That is, in the display apparatus according to the aspect of the present disclosure, changes in the characteristics of the second semiconductor pattern 221 in each pixel PA due to hydrogen contained in the first gate insulating layer 121 and the second gate insulating layer 122 may be prevented. Therefore, in the display apparatus according to the aspect of the present disclosure, the deterioration of the image due to hydrogen and oxygen may be effectively prevented.

The first semiconductor pattern 211 of each pixel area PA may be disposed between the buffer insulating layer 110 and the first gate insulating layer 121. For example, the first semiconductor pattern 211 of each pixel area PA may be in direct contact with the buffer insulating layer 110 and the first gate insulating layer 121. The first thin film transistor T1 of each pixel area PA may be quickly turned-on/off according to the gate signal applied to the corresponding pixel area PA. That is, in the display apparatus according to the aspect of the present disclosure, deviation in characteristics of the first thin film transistor T1 in each pixel area PA may not have a significant effect on the quality of the image. In the display apparatus according to the aspect of the present disclosure, the first semiconductor pattern 211 of each pixel area PA may be aged by oxygen contained in the buffer insulating layer 110. Thus, in the display apparatus according to the aspect of the present disclosure, deviation in a threshold voltage of the first thin film transistors T1 generated during the process may be alleviated. Therefore, in the display apparatus according to the aspect of the present disclosure, the quality of the image may be improved.

And, in the display apparatus according to the aspect of the present disclosure, the first gate insulating layer 121 and the second gate insulating layer 122 may include nitride having a relative higher dielectric constant than oxide. Thus, in the display apparatus according to the aspect of the present disclosure, the on-current of the first thin film transistor T1 and the second thin film transistor T2 may be increased. Therefore, in the display apparatus according to the aspect of the present disclosure, the electric characteristics of the first thin film transistor T1 and the electric characteristics of the second thin film transistor T2 in each pixel area PA may be improved.

The buffer insulating layer 110 and the first gate insulating layer 121 may be disposed between the second light-blocking pattern 320 and the second semiconductor pattern 221 of each pixel area PA, and the second gate insulating layer 122 may be disposed between the second semiconductor pattern 221 and the second gate electrode 223 of each pixel area PA. In the second thin film transistor T2 on the second light-blocking pattern 320 in each pixel area PA, the amount of change in the effective gate voltage may be determined by the following equation. Herein, $\Delta V_{eff}$ denotes the amount of change in the effective gate voltage, $\Delta V_{GAT}$ denotes a change amount of a voltage applied to the second gate electrode 223, C1 denotes a capacitance of the parasitic capacitor formed between the second light-blocking pattern 320 and the second semiconductor pattern 221, C2 denotes a capacitance of a parasitic capacitor formed between the second semiconductor pattern 221 and the second gate electrode 223, and $C_{ACT}$ denotes a capacitance of a parasitic capacitor formed by a voltage applied to the second source region and the second drain region of the second semiconductor pattern 221.

$$\Delta V_{eff} = \frac{C2}{C2 + C_{ACT} + C1} \times \Delta V_{GAT} \quad \text{[equation]}$$

In general, a capacitance of a capacitor is inversely proportional to a distance between the conductors constituting the capacitor. For example, when a thickness of the first gate insulating layer 121 is reduced based on a thickness of the second gate insulating layer 122, an effective gate voltage of the second thin film transistor T2 may be reduced. And, when the effective gate voltage of the second thin film transistor T2 is reduced, S-factor, which means the inverse ratio of the current change according to the change in voltage applied to the second gate electrode 223 of the second thin film transistor T2, increases. For example, when the effective gate voltage of the second thin film transistor T2 is reduced, the rate of change in the current according to the voltage applied to the second gate electrode 223 of the second thin film transistor T2 may decrease. That is, in the display apparatus according to the aspect of the present disclosure, the first gate insulating layer 121 may be formed to have a relatively thin thickness, such that the rate of change in the current according to the voltage applied to the second gate electrode 223 may decrease. For example, a thickness of the first gate insulating layer 121 may be smaller than a thickness of the second gate insulating layer 122. Thus, in the display apparatus according to the aspect of the present disclosure, the occurrence of spots in the low grayscale may be prevented.

The interlayer insulating layer 130 may be disposed on the second gate insulating layer 122. The interlayer insulating layer 130 may cover the first gate electrode 213 and the second gate electrode 223 of each pixel area PA. For example, the gate electrode 212 and 223 of each thin film transistor T1 and T2 may be insulated from the source electrode 215 and 225 and the drain electrode 217 and 227 of the corresponding thin film transistor T1 and T2 by the interlayer insulating layer 130. The source electrode 215 and 225 and the drain electrode 217 and 227 of each thin film transistor T1 and T2 may be disposed on the interlayer insulating layer 130. The interlayer insulating layer 130 may extend between the first capacitor electrode 201 and the second capacitor electrode 202 of each pixel area PA. For example, a portion of the interlayer insulating layer 130 in each pixel area PA may function as a capacitor insulating layer of the storage capacitor Cst in the corresponding pixel area PA. The interlayer insulating layer 130 may include an insulating material. The interlayer insulating layer 130 may have an etch selectivity with the first insulating layer 121 and the second insulating layer 122. For example, the interlayer insulating layer 130 may be an inorganic insulating layer made of silicon oxide (SiOx).

The first planarization layer 140 may be disposed on the interlayer insulating layer 130. For example, the source electrodes 215 and 225, the drain electrodes 225 and 227 and the second capacitor electrode 202 of each pixel area PA may be covered by the first planarization layer 140. The second planarization layer 150 may be disposed on the first planarization layer 140. The first planarization layer 140 and the second planarization layer 150 may remove a thickness difference due to the pixel driving circuit DC of each pixel area PA. For example, an upper surface of the second planarization layer 150 opposite to the device substrate 100 may be a flat surface.

The first planarization layer 140 and the second planarization layer 150 may include an insulating material. The first planarization layer 140 and the second planarization layer 150 may include a material different from the interlayer insulating layer 130. For example, the first planarization layer 140 and the second planarization layer 150 may be an organic insulating layer including an organic insulating material. The second planarization layer 150 may include a same material as the first planarization layer 140. The second planarization layer 150 may be in direct contact with an upper surface of the first planarization layer 140 opposite to the device substrate 100. For example, the first planarization layer 140 and the second planarization layer 150 may be physically connected. A boundary line between the first planarization layer 140 and the second planarization layer 150 may be not recognized.

The light-emitting device 500 of each pixel area PA may be disposed on the second planarization layer 150. For example, the first electrode 510, the light-emitting layer 520 and the second electrode 530 of each pixel area PA may be sequentially stacked on the second planarization layer 150 disposed on the corresponding pixel area PA. The first electrode 510 of each pixel area PA may be in direct contact with the upper surface of the second planarization layer 150. Thus, in the display apparatus according to the aspect of the present disclosure, luminance deviation according to a generation position of the light emitted from the light-emitting device 500 may be prevented.

Intermediate electrodes 410 may be disposed between the first planarization layer 140 and the second planarization layer 150. The intermediate electrodes 410 may include a conductive material. For example, the intermediate electrodes 410 may include a metal, such as aluminum (Al), chrome (Cr), copper (Cu), molybdenum (Mo), titanium (Ti) and tungsten (W). The first electrode 510 of each pixel area PA may be electrically connected to the second drain electrode 227 of the corresponding pixel area PA through one of the intermediate electrodes 410. For example, each of the intermediate electrodes 410 may be in direct contact with the second drain electrode 227 of each pixel area PA penetrating the first planarization layer 140 of the corresponding pixel area PA, and the first electrode 510 of each pixel area PA may be in direct contact with one of the intermediate electrodes 410 penetrating the second planarization layer 150 of the corresponding pixel area PA.

The bank insulating layer 160 may be disposed on the second planarization layer 150. The bank insulating layer 160 may define an emission area in each pixel area PA. For example, the bank insulating layer 160 may cover an edge of the first electrode 510 in each pixel area PA. The light-emitting layer 520 and the second electrode 530 of each pixel area PA may be sequentially stacked on a portion of the corresponding first electrode 510 exposed by the bank insulating layer 160. The bank insulating layer 160 may include an insulating material. For example, the bank insulating layer 160 may be an organic insulating layer including an organic insulating material. The bank insulating layer 160 may include a material different from the second planarization layer 150.

At least portion of the light-emitting layer 520 of each pixel area PA may extend onto the bank insulating layer 160. For example, at least one of the hole injection layer (HIL), the hole transport layer (HTL), the electron transport layer (ETL) and the electron injection layer (EL) may be formed on the entire surface of a display area AA in which the pixel areas PA are disposed. For example, in the display apparatus according to the aspect of the present disclosure, the process efficiency may be improved.

A voltage applied to the second electrode 530 of each pixel area PA may be the same as a voltage applied to the second electrode 530 of adjacent pixel area PA. For example, the second electrode 530 of each pixel area PA may be electrically connected to the second electrode 530 of adjacent pixel area PA. The second electrode 530 of each pixel area PA may include a same material as the second electrode 530 of adjacent pixel area PA. For example, the second electrode 530 of each pixel area PA may be formed simultaneously with the second electrode 530 of adjacent pixel area PA. The second electrode 530 of each pixel area PA may be in direct contact with the second electrode 530 of adjacent pixel area PA. For example, the second electrode 530 of each pixel area PA may extend onto the bank insulating layer 160. The bank insulating layer 160 may be covered by the second electrode 530. Thus, in the display apparatus according to the aspect of the present disclosure, a process of forming the second electrode 530 in each pixel area PA may be simplified. And, in the display apparatus according to the aspect of the present disclosure, the luminance of the light emitted from the light-emitting device 500 of each pixel area PA may be adjusted by the data signal applied to the pixel driving circuit DC of the corresponding pixel area PA.

An encapsulation unit 600 may be disposed on the light-emitting device 500 of each pixel area PA. The encapsulation unit 600 may prevent damages of the light-emitting devices 500 due to external moisture and impact. The encapsulation unit 600 may have a multi-layer structure. For example, the encapsulation unit 600 may include a first encapsulating layer 610, a second encapsulating layer 620 and a third encapsulating layer 630, which are sequentially stacked. The first encapsulating layer 610, the second encapsulating layer 620 and the third encapsulating layer 630 may include an insulating material. The second encapsulating layer 620 may include a material different from the first encapsulating layer 610 and the third encapsulating layer 630. For example, the first encapsulating layer 610 and the third encapsulating layer 630 may be an inorganic insulating layer made of silicon nitride (SiNx) or silicon oxide (SiOx), and the second encapsulating layer 620 may be an organic insulating layer including an organic insulating material. Thus, in the display apparatus according to the aspect of the present disclosure, the damages of the light-emitting devices 500 due to the external moisture and impact may be effectively prevented.

The display panel DP may include a bezel area BZ disposed outside the display area AA. At least one of the gate driver GD, the data driver DD, the power unit PU and the timing controller TC may be disposed on the bezel area BZ of the display panel DP. For example, the display apparatus according to the aspect of the present disclosure may be a GIP (Gate In Panel) type display apparatus in which the gate driver GD is formed in the bezel area BZ of the display panel DP. The gate driver GD may include at least one circuit thin film transistor 290.

The circuit thin film transistor 290 may be disposed on the bezel area BZ of the device substrate 100. The circuit thin film transistor 290 may include a circuit semiconductor pattern 291, a circuit gate electrode 293, a circuit source electrode 295 and a circuit drain electrode 297. The circuit thin film transistor 290 may be formed using a process of forming the pixel driving circuit DC of each pixel area PA. The circuit thin film transistor 290 may be quickly turned-on/off according to the corresponding signal. For example, the circuit thin film transistor 290 may be formed simultaneously with the first thin film transistor T1 of each pixel area PA.

The circuit semiconductor pattern 291 may be disposed on a same layer as the first semiconductor pattern 211 of each pixel area PA. For example, the circuit semiconductor pattern 291 may be disposed between the buffer insulating layer 110 and the first gate insulating layer 121 of the bezel area BZ. The circuit semiconductor pattern 291 may be in direct contact with the buffer insulating layer 110 and the first gate insulating layer 121. The circuit semiconductor pattern 291 may include a same material as the first semiconductor pattern 211 of each pixel area PA. For example, the circuit semiconductor pattern 291 may include an oxide semiconductor, such as IGZO.

The circuit gate electrode 293 may be disposed on a same layer as the first gate electrode 213 of each pixel area PA. For example, the circuit gate electrode 293 may be disposed between the second gate insulating layer 122 and the interlayer insulating layer 130 of the bezel area BZ. The circuit gate electrode 293 may include a same material as the first gate electrode 213 of each pixel area PA. For example, the circuit gate electrode 293 may include a metal, such as aluminum (Al), chrome (Cr), copper (Cu), molybdenum (Mo), titanium (Ti) and tungsten (W).

The circuit source electrode 295 and the circuit drain electrode 297 may be disposed on a same layer as the first source electrode 215 and the first drain electrode 217 of each pixel area PA. For example, the circuit source electrode 295 and the circuit drain electrode 297 may be disposed between the interlayer insulating layer 130 and the first planarization layer 140 of the bezel area BZ. The circuit source electrode 295 and the circuit drain electrode 297 may include a same material as the first source electrode 215 and the first drain electrode 217 of each pixel area PA. For example, the circuit drain electrode 295 and the circuit source electrode 297 may include a metal, such as aluminum (Al), chrome (Cr), copper (Cu), molybdenum (Mo), titanium (Ti) and tungsten (W).

A circuit light-blocking pattern 390 may be disposed between the device substrate 100 and the circuit semiconductor pattern 291. The circuit light-blocking pattern 390 may be disposed on a same layer as the first light-blocking pattern 310 of each pixel area PA. For example, the circuit light-blocking pattern 390 may be disposed between the device substrate 100 and the buffer insulating layer 110. The circuit light-blocking pattern 390 may include a same material as the first light-blocking pattern 310 of each pixel area PA. For example, the circuit light-blocking pattern 390 may be formed simultaneously with the first light-blocking pattern 310 of each pixel area PA.

In the display apparatus according to the aspect of the present disclosure, the display area AA may include a hole area HA between the pixel areas PA. The hole area PA may be a region for electronic devices, such as a camera module and a fingerprint recognition device. For example, the plurality of insulating layers 110, 120, 130, 140, 150 and 160 for preventing unnecessary electrical connection in each pixel area PA may be removed in the hole area HA of the device substrate 100, as shown in FIG. 4.

A separating area SA may be disposed between the hole area HA and the pixel areas PA. At least one dam 105 may be disposed on the separating area SA of the device substrate 100. The dam 105 may block a flow of the second encapsulating layer 620, which is an organic insulating layer. For example, the second encapsulating layer 620 may be formed in a region defined by the dam 105. The dam 105 may be formed using a process of forming the plurality of insulating layers 110, 120, 130, 140, 150 and 160. For example, the dam 105 may be formed simultaneously with the first planarization layer 140. The dam 105 may have a same thickness as the first planarization layer 140. The dam 105 may include a same material as the first planarization layer 140. The dam 105 may be spaced apart from the first planarization layer 140, the second planarization layer 150 and the bank insulating layer 160. For example, the first planarization layer 140, the second planarization layer 150 and the bank insulating layer 160 may be not disposed on at least portion of the separating area SA. Thus, in the display apparatus according to the aspect of the present disclosure, efficiency of the electronic devices arranged in the hole area HA may be improved.

The light-emitting layer 520 may be disconnected on the separating area SA. For example, an under-cut structure UC by the second gate insulating layer 122 and the interlayer insulating layer 130 may be disposed on the separating area SA of the device substrate 100. The inorganic insulating layer made of fluorinated silicon nitride (SiNF) may be etched faster than the inorganic insulating layer made of silicon oxide (SiOx). The etching speed of the inorganic insulating layer made of fluorinated silicon nitride (SiNF) may be about 4800 Å/min, and the etching speed of the inorganic insulating layer made of silicon oxide (SiOx) may be about 2000 Å/min. Thus, in the display apparatus according to the aspect of the present disclosure, the under-cut structure UC for the disconnection of the light-emitting layer 520 may be formed by a single etching process. For example, in the display apparatus according to the aspect of the present disclosure, the second gate insulating layer 122 made of fluorinated silicon nitride (SiNF) and the interlayer insulating layer 130 made of silicon oxide (SiOx) may be simultaneously etched, such that the under-cut structure UC may be formed by over-etching the second gate insulating layer 122. Therefore, in the display apparatus according to the aspect of the present disclosure, a process of forming the under-cur structure UC for the disconnection of the light-emitting layer 520 may be simplified.

An end of the first gate insulating layer 121 and an end of the second gate insulating layer 122 on the separating area SA may be disposed closer to the pixel areas PA than an end of the interlayer insulating layer SA on the separating area SA. Thus, in the display apparatus according to the aspect of the present disclosure, the under-cut structure UC by the second gate insulating layer 122 and the interlayer insulating layer 130 may be formed to have a depth greater than a thickness of the light-emitting layer 520. That is, in the display apparatus according to the aspect of the present disclosure, an organic pattern 520*p* separated from the light-emitting layer 520 by the under-cut structure UC may be sufficiently spaced apart from the light-emitting layer 520. Thus, in the display apparatus according to the aspect of the present disclosure, inflow of moistures into the pixel areas PA through the hole area HA may be prevented.

The under-cut structure UC may be disposed between the dam 105 and the hole area HA. The first encapsulating layer 610 and the third encapsulating layer 630 in which is an inorganic insulating layer may extend on the hole area HA along a surface of the dam 105. For example, the organic pattern 520*p* separated from the light-emitting layer 520 by the under-cut structure UC may be covered by the first encapsulating layer 610 and the third encapsulating layer 630. Thus, in the display apparatus according to the aspect of the present disclosure, a thickness of insulating layer stacked on the hole area HA may be minimized, and the inflow of moistures through the hole area HA may be prevented.

Accordingly, the display apparatus according to the aspect of the present disclosure may include the light-emitting device 500 and the pixel driving circuit DC generating the driving current corresponding to the data signal according to the gate signal on the each pixel area, wherein the pixel driving circuit DC may include the second thin film transistor T2 electrically connected to the first electrode 510 of the light-emitting device 500, wherein the second semiconductor pattern 221 of the second thin film transistor T2 may include an oxide semiconductor, and wherein the second semiconductor pattern 221 may surrounded by the inorganic insulating layer made of fluorinated silicon nitride (SiNF). Thus, in the display apparatus according to the aspect of the present disclosure, deviation in characteristics of the second thin film transistor T2 due to inflow of hydrogen and oxygen may be prevented. Therefore, in the display apparatus according to the aspect of the present disclosure, the deterioration of the image due to hydrogen and oxygen may be prevented.

And, in the display apparatus according to the aspect of the present disclosure, the interlayer insulating layer 130 for insulating the gate electrode 213 and 223 of each thin film transistor T1 and T2 from the source electrode 215 and 225 and the drain electrode 217 and 227 of the corresponding thin film transistor T1 and T2 may have an etch selectivity with the first gate insulating layer 121 and the second gate insulating layer 122. Thus, in the display apparatus according to the aspect of the present disclosure, a process of forming the under-cut structure UC for disconnecting the light-emitting layer 520 between the hole area HA and the pixel areas PA may be simplified. Therefore, in the display apparatus according to the aspect of the present disclosure, the process efficiency may be improved.

Figure 5:
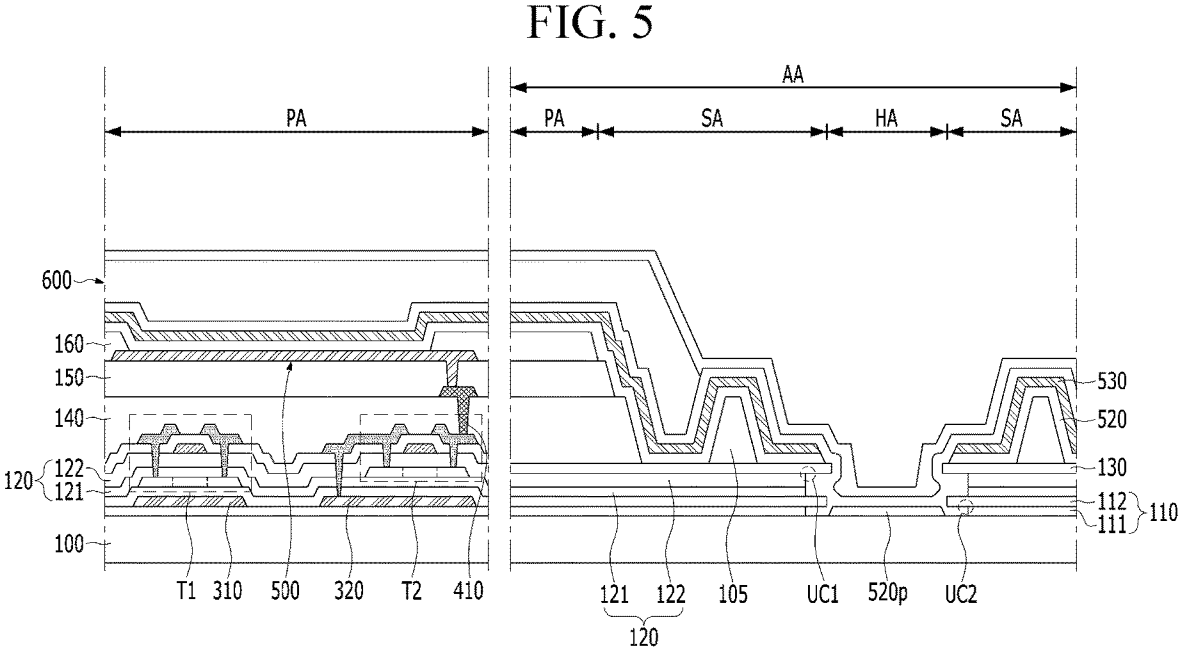
FIGS. 5 to 11 are views showing the display apparatus according to another aspect of the present disclosure.

The display apparatus according to the aspect of the present disclosure is described that the buffer insulating layer 110 has a single-layer structure. However, in the display apparatus according to another aspect of the present disclosure, the buffer insulating layer 110 may have a multi-layer structure. For example, in the display apparatus according to the aspect of the present disclosure, the buffer insulating layer 110 may have a stacked structure of a lower buffer layer 111 and an upper buffer layer 112, as shown in FIG. 5. The lower buffer layer 111 may be disposed between the device substrate 100 and the upper buffer layer 112. The lower buffer layer 111 may include a material different from the upper buffer layer 112. The lower buffer insulating layer 111 may include a material having an etch selectivity with the upper buffer layer 112. For example, the lower buffer layer may be an inorganic insulating layer made of silicon nitride (SiNx), and the upper buffer layer may be an inorganic insulating layer made of silicon oxide (SiOx). The inorganic insulating layer made of silicon nitride (SiNx) may be etched faster than the inorganic insulating layer made of silicon oxide (SiOx). For example, the etching speed of the inorganic insulating layer made of silicon nitride (SiNx) may be about 4000 Å/min. An end of the lower buffer layer 111 on the separating area SA may be disposed closer to the pixel areas PA than an end of the upper buffer layer 112 on the separating area SA. Thus, in the display apparatus according to another aspect of the present disclosure, a first under-cut structure UC1 by the second gate insulating layer 122 and the interlayer insulating layer 130 and a second under-cut structure UC2 by the lower buffer layer 111 and the upper buffer layer 112 may be disposed on the separating area SA. Therefore, in the display apparatus according to another aspect of the present disclosure, the disconnection of the light-emitting layer 520 may be effectively performed.

Figures 6, 7:
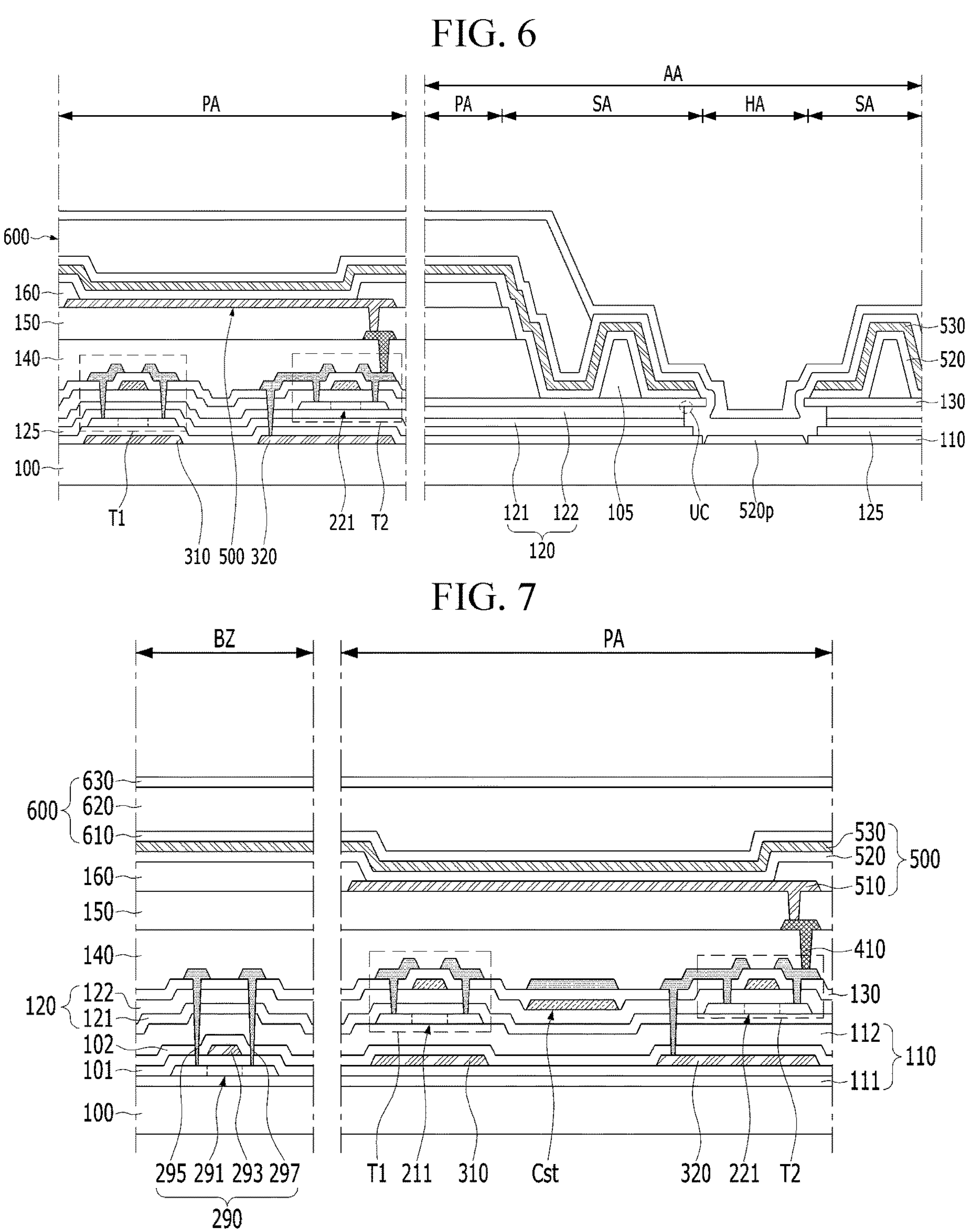

The display apparatus according to the aspect of the present disclosure is described that the first gate insulating layer 121 is in direct contact with the first semiconductor pattern 221 of each pixel area PA. However, in the display apparatus according to another aspect of the present disclosure, at least one insulating layer may be arranged between the first semiconductor pattern 211 of each pixel area PA and the first gate insulating layer 121. For example, in the display apparatus according to another aspect of the present disclosure, an intermediate gate insulating layer 125 may be disposed between the first semiconductor pattern 211 of each pixel area PA and the first gate insulating layer 121, as shown in FIG. 6. The intermediate gate insulating layer 125 may include a material different from the buffer insulating layer 110 and the first gate insulating layer 121. The intermediate gate insulating layer 125 may have relatively low hydrogen content. For example, the intermediate gate insulating layer 125 may be an inorganic insulating layer made of fluorinated silicon oxide (SiOF). Thus, in the display apparatus according to another aspect of the present disclosure, the first semiconductor pattern 211 of each pixel area PA may be aged by oxygen contained in the buffer insulating layer 110 and oxygen contained in the intermediate insulating layer 125. And, in the display apparatus according to another aspect of the present disclosure, hydrogen traveling from the device substrate 100 toward the second semiconductor pattern 221 of each pixel area PA may be blocked by the intermediate gate insulating layer 125 and the first gate insulating layer 121. Therefore, in the display apparatus according to another aspect of the present disclosure, deviation in a threshold voltage of the first thin film transistor T1 in each pixel area PA may be effectively alleviated, and the inflow of hydrogen into the second semiconductor pattern 221 of each pixel area PA may be effectively blocked.

The intermediate gate insulating layer 125 may be etched faster than the interlayer insulating layer 130. For example, the etching speed of the inorganic insulating layer made of fluorinated silicon oxide (SiOF) may be about 4000 Å/min. Thus, in the display apparatus according to another aspect of the present disclosure, a depth of the under-cut structure UC on the separating area SA may be increased. Therefore, in the display apparatus according to another aspect of the present disclosure, the disconnection of the light-emitting layer 520 may be effectively performed.

Figure 8:
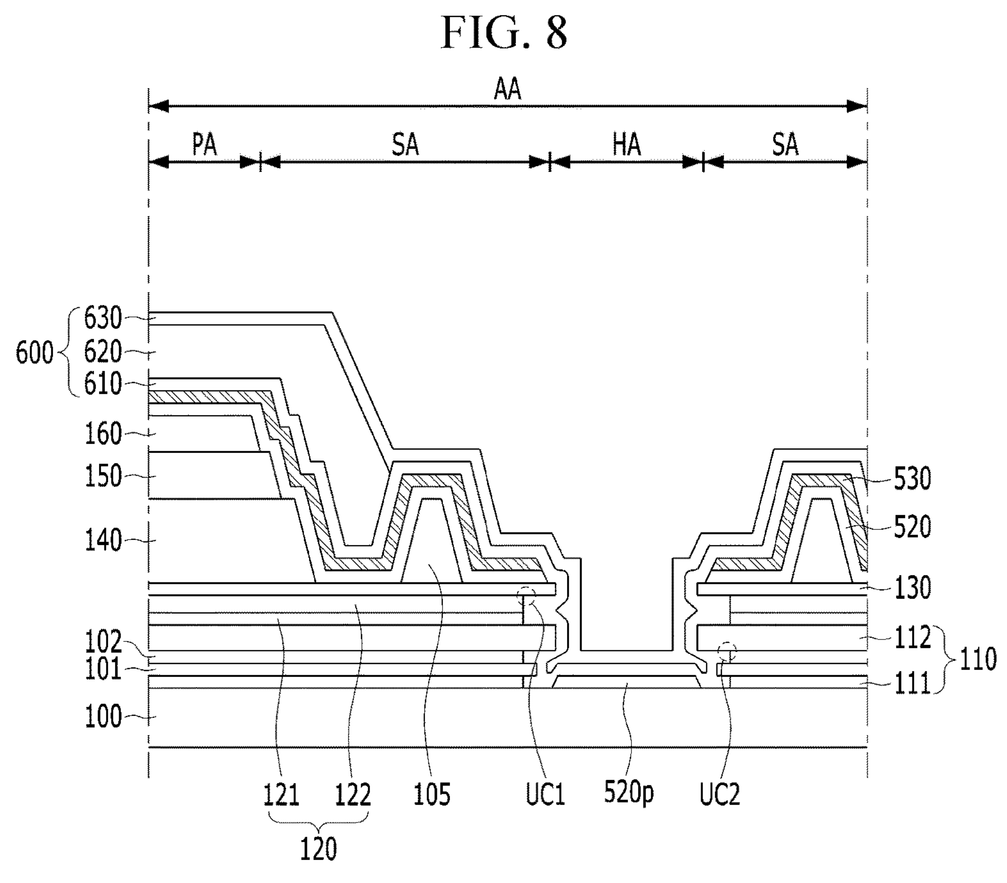
Figure 9:
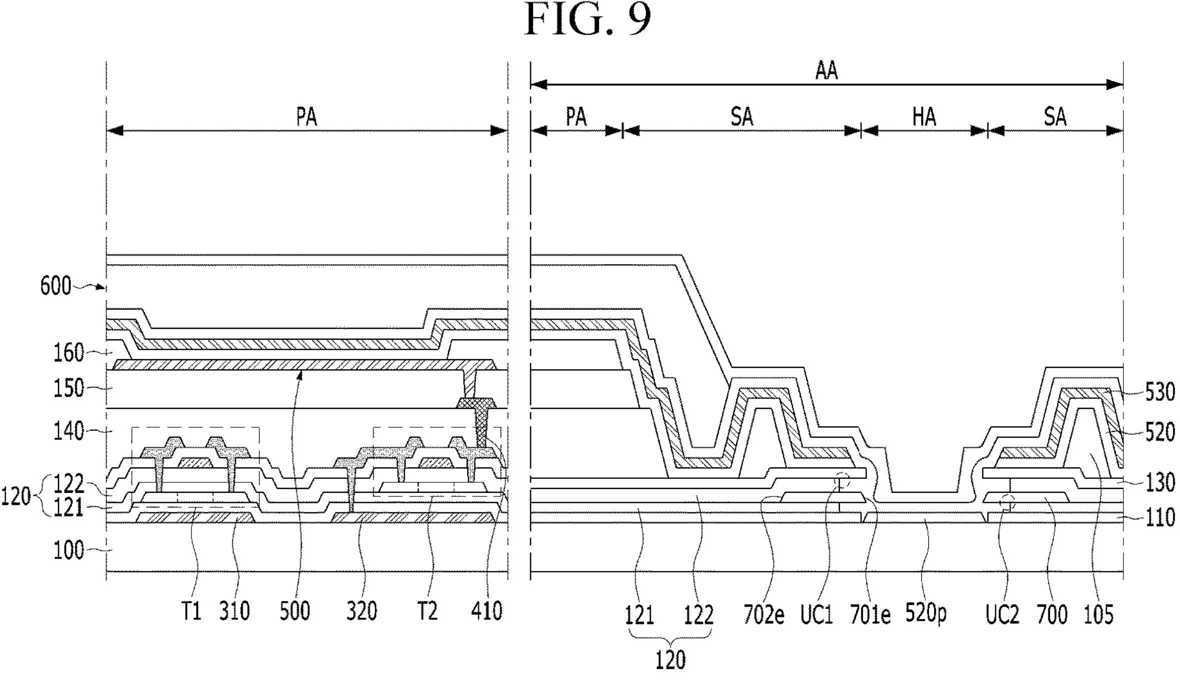

The display apparatus according to the aspect of the present disclosure is described that the circuit thin film transistor 290 on the bezel area BZ is formed simultaneously with the first thin film transistor T1 of each pixel area PA. However, in the display apparatus according to another aspect of the present disclosure, the circuit semiconductor pattern 291 of the circuit thin film transistor 290 may include a material different from the first semiconductor pattern 211 of each pixel area PA. For example, in the display apparatus according to another aspect of the present disclosure, the circuit semiconductor pattern 291 of the circuit thin film transistor 290 may include a low-temperature poly-Si (LTPS). The circuit semiconductor pattern 291 of the circuit thin film transistor 290 may be disposed on a layer different from the first semiconductor pattern 211 of each pixel area PA. For example, in the display apparatus according to another aspect of the present disclosure, a lower gate insulating layer 101 and a buffer intermediate layer 102 may be sequentially stacked between the lower buffer layer 111 and the upper buffer layer 112 of the buffer insulating layer 110, the circuit semiconductor pattern 291 may be disposed between the lower buffer layer 111 and the lower gate insulating layer 101, and the circuit gate electrode 293 of the circuit thin film transistor 290 may be disposed between the lower gate insulating layer 101 and the buffer intermediate layer 102, as shown in FIGS. 7 and 8. Thus, in the display apparatus according to another aspect of the present disclosure, the circuit thin film transistor 290 may have an electric characteristics different from the first thin film transistor T1 of each pixel area PA. Therefore, in the display apparatus according to another aspect of the present disclosure, the degree of freedom to configuration of the gate driver on the bezel area BZ may be improved.

The first light-blocking pattern 310 and the second light-blocking pattern 320 of each pixel area PA may include a same material as the circuit gate electrode 293. The first light-blocking pattern 310 and the second light-blocking pattern 320 of each pixel area PA may be formed simultaneously with the circuit gate electrode 293. For example, the first light-blocking pattern 310 and the second light-blocking pattern 320 of each pixel area PA may be disposed between the lower gate insulating layer 101 and the buffer intermediate layer 102. Thus, in the display apparatus according to another aspect of the present disclosure, the process efficiency may be improved.

The lower gate insulating layer 101 and the buffer intermediate layer 102 may include an insulating material. The lower gate insulating layer 101 may include a material having a relatively high dielectric. For example, the lower gate insulating layer 101 may be an inorganic insulating layer made of fluorinated silicon oxide (SiOF). The buffer intermediate layer 102 may include a material having an etch selectivity with the upper buffer layer 112. For example, the buffer intermediate layer 102 may be an inorganic insulating layer made of silicon nitride (SiNx). Thus, in the display apparatus according to another aspect of the present disclosure, an end of the lower gate insulating layer 101 and an end of the buffer intermediate layer 102 on the separating area SA may be disposed closer to the pixel areas PA than an end of the upper buffer layer 112 on the separating area SA. That is, in the display apparatus according to another aspect of the present disclosure, a first under-cut structure UC1 by the second gate insulating layer 122 and the interlayer insulating layer 130 and a second under-cut structure UC2 by the buffer intermediate layer 102 and the upper buffer layer 112 may be disposed on the separating area SA. The upper buffer layer 112 may have a thickness greater than the lower buffer layer 111. Therefore, in the display apparatus according to another aspect of the present disclosure, a damage of the circuit thin film transistor 290 due to a process of forming the first thin film transistor T1 and the second thin film transistor T2 in each pixel area PA may be prevented. And, in the display apparatus according to another aspect of the present disclosure, a height difference by the first under-cut structure UC1 and the second under-cut structure UC2 may be increased, and the disconnection of the light-emitting layer 520 may be effectively performed.

In the display apparatus according to another aspect of the present disclosure, a separation pattern 700 for the disconnection of the light-emitting layer 520 may be disposed on the separating area SA of the device substrate 100. For example, in the display apparatus according to another aspect of the present disclosure, the separation pattern 700 may be disposed between the first gate insulating layer 121 and the second gate insulating layer 122 of the separating area SA. The separation pattern 700 may be disposed in the separating area SA. For example, the separation pattern 700 may include a first end 701*e* toward the hole area HA and a second end 702*e* toward the pixel areas PA, and the first end 701*e* and the second end 702*e* of the separation pattern 700 may be disposed on the separating area SA. The separation pattern 700 may have an etch selectivity with the first gate insulating layer 121 and the second gate insulating layer 122. For example, the separation pattern 700 may include the second semiconductor pattern 221 of each pixel area PA. The separation pattern 700 may be formed simultaneously with the second semiconductor pattern 221 of each pixel area PA. The end of the first gate insulating layer 121 and the end of the second gate insulating layer 122 on the separating area SA may be disposed closer to the pixel areas PA than the first end 701*e* of the separation pattern 700. Thus, in the display apparatus according to another aspect of the present disclosure, a first under-cut structure UC1 by the second gate insulating layer 122 and the interlayer insulating layer 130 and a second under-cut structure UC2 by the first gate insulating layer 121 and the separation pattern 700 may be disposed on the separating area SA. Therefore, in the display apparatus according to another aspect of the present disclosure, the disconnection of the light-emitting layer 520 may be effectively performed.

Figures 10, 11:
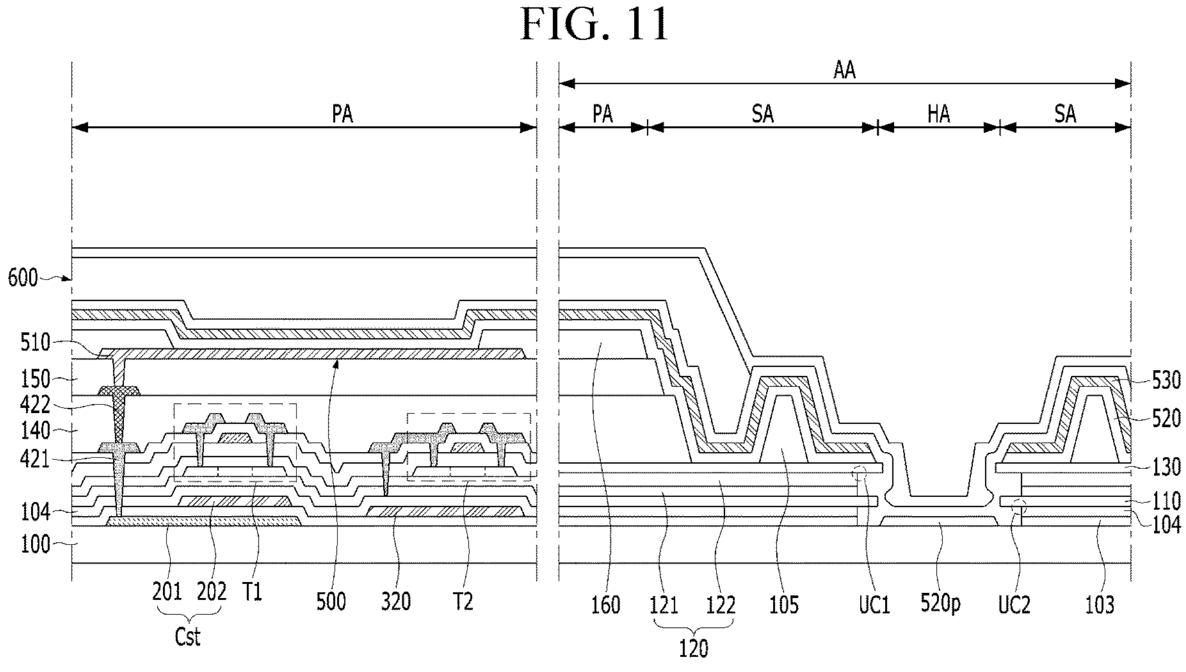

The display apparatus according to the aspect of the present disclosure is described that the pixel driving circuit DC of each pixel area PA includes two thin film transistors T1 and T2. However, in the display apparatus according to another aspect of the present disclosure, the pixel driving circuit DC of each pixel area PA may include a single driving thin film transistor and a plurality of switching thin film transistors. For example, in the display apparatus according to another aspect of the present disclosure, the pixel driving circuit DC of each pixel area PA may include six thin film transistors T1, T2, T3, T4, T5 and T6, and a single storage capacitor Cst, as shown in FIG. 10. A first thin film transistor T1 of each pixel driving circuit DC may be turned on by a second gate signal GL2, to supply the data signal to a third node N3. A third thin film transistor T3 of each pixel driving circuit DC may be turned on by a first gate signal GL1, to diode-connect a first node N1 and a second node N2. A fourth thin film transistor T4 of each pixel driving circuit DC may be turned on by a first emission control signal EM1, to supply a power voltage applied through the power voltage supply line PL to the second node N2. A fifth thin film transistor T5 of each pixel driving circuit DC may be turned on by a second emission control signal EM2, to electrically connect the third node N3 to a fifth node N5. A sixth thin film transistor T6 of each pixel driving circuit DC may be turned on by the first gate signal GL1, to supply a reference voltage applied through a reference voltage supply line RL to a fourth node N4. The storage capacitor Cst of each pixel driving circuit DC may be electrically connected between the first node N1 and the fourth node N4. The second thin film transistor T2 of each pixel driving circuit DC may generate a driving current corresponding to the data signal applied to the third node N3 using a power voltage supplied to the second node N2. For example, the second thin film transistor T2 of each pixel driving circuit DC may be a driving thin film transistor. Thus, in the display apparatus according to another aspect of the present disclosure, the degree of freedom to configuration of each pixel driving circuit DC may be improved.

The display apparatus according to the aspect of the present disclosure is described that the storage capacitor Cst of each pixel area PA is formed simultaneously with the first thin film transistor T1 and the second thin film transistor T2 of the corresponding pixel area PA. However, in the display apparatus according to another aspect of the present disclosure, the storage capacitor Cst of each pixel area PA may be formed on a layer different from the thin film transistors T1 and T2 of the corresponding pixel area PA. For example, in the display apparatus according to another aspect of the present disclosure, a first capacitor electrode 201 and a second capacitor electrode 202 of the storage capacitor Cst in each pixel area PA may be disposed between the device substrate 100 and the first thin film transistor T1 of the corresponding pixel area PA, as shown in FIG. 11. A first lower insulating layer 103 between the first capacitor electrode 201 and the second capacitor electrode 202 of each pixel area PA may extend between the device substrate 100 and the second light-blocking pattern 320 of each pixel area PA. The first lower insulating layer 103 may include an insulating material. The first lower insulating layer 103 may include a material having a relatively high dielectric. For example, the first lower insulating layer 103 may be an inorganic insulating layer made of silicon nitride (SiNx). A portion of the first lower insulating layer 103 on each pixel area PA may function as a capacitor insulating layer of the storage capacitor Cst in the corresponding pixel area PA.

The second capacitor electrode 202 of each pixel area PA may be disposed on a same layer as the second light-blocking pattern 320 of the corresponding pixel area PA. The second capacitor electrode 202 of each pixel area PA may include a same material as the second light-blocking pattern 320 of the corresponding pixel area PA. The first capacitor electrode 201 and the second capacitor electrode 202 of each pixel area PA may overlap with the first semiconductor pattern of the first thin film transistor T1 in the corresponding pixel area PA. The external light in a direction of the first semiconductor pattern of each pixel area PA passing through the device substrate 100 may be blocked by the storage capacitor Cst of the corresponding pixel area PA. For example, the first capacitor electrode 201 and the second capacitor electrode 202 of each pixel area PA may function as a first light-blocking pattern of the corresponding pixel area PA. Thus, in the display apparatus according to another aspect of the present disclosure, the process efficiency may be improved.

A second lower insulating layer 104 may be disposed on the second capacitor electrode 202 and the second light-blocking pattern 320 of each pixel area PA. The second lower insulating layer 104 may be extend beyond the second capacitor electrode 202 and the second light-blocking pattern 320 in each pixel area PA. The buffer insulating layer 110 may be disposed on the second lower insulating layer 104. The second lower insulating layer 104 may include an insulating material. The second lower insulating layer 104 may have an etch selectivity with the buffer insulating layer 110. For example, the second lower insulating layer 104 may be an inorganic insulating layer made of silicon nitride (SiNx). The second lower insulating layer 104 may include a same material as the first lower insulating layer 103.

The first lower insulating layer 103 and the second lower insulating layer 104 may extend onto the separating area SA of the device substrate 100. For example, a first under-cut structure UC1 by the second gate insulating layer 122 and the interlayer insulating layer 130 and a second under-cut structure UC 2 by the second lower insulating layer 104 and the buffer insulating layer 110 may be disposed on the separating area SA of the device substrate 100. Thus, in the display apparatus according to another aspect of the present disclosure, the disconnection of the light-emitting layer 520 by the first under-cut structure UC1 and the second under-cut structure UC2 may be effectively performed.

In the display apparatus according to another aspect of the present disclosure, the driving current generated by the second thin film transistor T2 of each pixel area PA may be supplied to the light-emitting device 500 of the corresponding pixel area PA through another conductive layer. For example, in the display apparatus according to another aspect of the present disclosure, a first intermediate electrode 421 penetrating the first lower insulating layer 103, the second lower insulating layer 104, the buffer insulating layer 110, the first gate insulating layer 121 and the second gate insulating layer 122 and a second intermediate electrode 422 penetrating the first planarization layer 140 may be disposed in each pixel area PA, and the first electrode 510 of each pixel area PA may be electrically connected to the first capacitor electrode 201 of the corresponding pixel area PA through the first intermediate electrode 421 and the second intermediate electrode 422 of the corresponding pixel area PA. Thus, in the display apparatus according to another aspect of the present disclosure, the degree of freedom for the configuration of each pixel area PA may be improved.

In the result, the display apparatus according to the aspects of the present disclosure may comprise the light-emitting device and the driving thin film transistor in the pixel area of the device substrate, wherein the driving semiconductor pattern of the driving thin film transistor electrically connected to the light-emitting device may include an oxide semiconductor, and wherein the driving semiconductor pattern may be surrounded by an insulating layer made of fluorinated silicon nitride (SiNF). Thus, in the display apparatus according to the aspects of the present disclosure, variation in the characteristics of the driving thin film transistor in each pixel area due to hydrogen and oxygen may be prevented. Thereby, in the display apparatus according to the aspects of the present disclosure, the quality of the image provided to the user may be improved.

The display apparatus according to the aspects of the present disclosure may form the under-cut structure for the disconnection of the light-emitting layer between the hole area and the pixel areas using an etch selectivity of the insulating layers disposed between the device substrate and the planarization layer. That is, in the display apparatus according to the aspects of the present disclosure, the light-emitting layer may be disconnected, without a process of forming additional layer. Thereby, in the display apparatus according to the aspects of the present disclosure, the process efficiency may be improved.

What is claimed is:

1. A display apparatus comprising:
a first insulating layer disposed on a device substrate;
a driving thin film transistor disposed on the device substrate and including a driving semiconductor pattern disposed on the first insulating layer;
a second insulating layer disposed on the first insulating layer, the second insulating layer covering the driving semiconductor pattern;
a light-emitting device disposed on the second insulating layer, the light-emitting device electrically connected to the driving thin film transistor:
a third insulating layer disposed between the device substrate and the first insulating layer; and
a circuit thin film transistor disposed on a circuit area of the device substrate and including a circuit semiconductor pattern between the third insulating layer and the first insulating layer,
wherein the driving semiconductor pattern includes an oxide semiconductor,
wherein each of the first insulating layer and the second insulating layer includes an inorganic insulating layer made of fluorinated silicon nitride (SiNF), and
wherein the third insulating layer includes an inorganic insulating layer made of silicon oxide (SiOx).

2. The display apparatus according to claim 1, wherein the driving semiconductor pattern is in contact with the first insulating layer and the second insulating layer.

3. The display apparatus according to claim 1, further comprising an interlayer insulating layer disposed between the second insulating layer and the light-emitting device,
wherein the interlayer insulating layer has an etch selectivity with the first insulating layer and the second insulating layer.

4. The display apparatus according to claim 3, wherein the interlayer insulating layer includes an inorganic insulating layer made of silicon oxide (SiOx).

5. The display apparatus according to claim 3, wherein the device substrate includes a separating area disposed between a hole area and a pixel area,
wherein the driving thin film transistor and the light-emitting device are disposed on the pixel area of the device substrate,
wherein an under-cut structure by the second insulating layer and the interlayer insulating layer is disposed on the separating area, and
wherein a light-emitting layer of the light-emitting device is disconnected by the under-cut structure of the separating area.

6. The display apparatus according to claim 5, further comprising a dam disposed on the separating area of the device substrate,
wherein the under-cut structure is disposed between the dam and the hole area.

7. The display apparatus according to claim 1, wherein the circuit semiconductor pattern includes an oxide semiconductor.

8. The display apparatus according to claim 1, further comprising a fourth insulating layer disposed between the third insulating layer and the first insulating layer,
wherein the fourth insulating layer covers the circuit semiconductor pattern, and
wherein the fourth insulating layer includes an inorganic insulating layer made of fluorinated silicon oxide (SiOF).

9. The display apparatus according to claim 8, wherein the circuit semiconductor pattern is in contact with the third insulating layer and the fourth insulating layer.

10. A display apparatus comprising:
a device substrate including a separating area between a hole area and a pixel area;
an upper buffer layer disposed on the pixel area and the separating area of the device substrate;
a first thin film transistor disposed on the pixel area of the device substrate, the first thin film transistor including a first semiconductor pattern on the upper buffer layer;
a first gate insulating layer disposed on the upper buffer layer and covering the first semiconductor pattern;
a second thin film transistor disposed on the pixel area of the device substrate, the second thin film transistor including a second semiconductor pattern on the first gate insulating layer;
a second gate insulating layer disposed on the first gate insulating layer and covering the second semiconductor pattern;
an interlayer insulating layer disposed on the second gate insulating layer and having an etch selectivity with the first gate insulating layer and the second gate insulating layer; and
a light-emitting device disposed on the interlayer insulating layer and electrically connected to the second thin film transistor,
wherein the first semiconductor pattern and the second semiconductor pattern include an oxide semiconductor,
wherein the first gate insulating layer and the second gate insulating layer include fluorinated silicon nitride (SiNF), and
wherein an end of the second gate insulating layer disposed on the separating area is closer to the pixel area than an end of the interlayer insulating layer disposed on the separating area.

11. The display apparatus according to claim 10, wherein a thickness of the first gate insulating layer is smaller than a thickness of the second gate insulating layer.

12. The display apparatus according to claim 10, further comprising a separating pattern disposed between the first gate insulating layer and the second gate insulating layer of the separating area,
wherein the separating pattern has an etch selectivity with the first gate insulating layer and the second gate insulating layer, and
wherein an end of the first gate insulating layer on the separating area is closer to the pixel area than an end of the separating pattern toward the hole area.

13. The display apparatus according to claim 12, wherein the separating pattern includes a same material as the second semiconductor pattern.

14. The display apparatus according to claim 10, further comprising a lower buffer layer disposed between the device substrate and the upper buffer layer,
wherein the upper buffer layer has an etch selectivity with the lower buffer layer, the first gate insulating layer and the second gate insulating layer, and
wherein an end of the lower buffer layer disposed on the separating area is closer to the pixel area than an end of the upper buffer layer disposed on the separating area.

* * * * *